US008227865B2

(12) United States Patent
Dennard et al.

(10) Patent No.: US 8,227,865 B2
(45) Date of Patent: Jul. 24, 2012

(54) LOW COST FABRICATION OF DOUBLE BOX BACK GATE SILICON-ON-INSULATOR WAFERS WITH BUILT-IN SHALLOW TRENCH ISOLATION IN BACK GATE LAYER

(75) Inventors: Robert H. Dennard, Croton-On-Hudson, NY (US); David R. Greenberg, White Plains, NY (US); Amlan Majumdar, White Plains, NY (US); Leathen Shi, Yorktown Heights, NY (US); Jeng-Bang Yau, Ossining, NY (US)

(73) Assignee: International Business Machines Corporation, Armonk, NY (US)

( * ) Notice: Subject to any disclaimer, the term of this patent is extended or adjusted under 35 U.S.C. 154(b) by 288 days.

(21) Appl. No.: 12/751,302

(22) Filed: Mar. 31, 2010

(65) Prior Publication Data

US 2010/0187607 A1 Jul. 29, 2010

Related U.S. Application Data

(62) Division of application No. 12/352,071, filed on Jan. 12, 2009, now Pat. No. 7,767,546.

(51) Int. Cl.
*H01L 27/01* (2006.01)

(52) U.S. Cl. .................... 257/347; 257/E29.275

(58) Field of Classification Search .......... 257/250, 257/347, 366, E21.623, E29.275
See application file for complete search history.

(56) References Cited

U.S. PATENT DOCUMENTS

| 5,882,987 | A | 3/1999 | Srikrishnan |
| 6,057,212 | A | 5/2000 | Chan et al. |
| 6,083,797 | A | 7/2000 | Wong et al. |
| 6,093,623 | A | 7/2000 | Forbes |
| 6,228,691 | B1 | 5/2001 | Doyle |
| 6,246,094 | B1 | 6/2001 | Wong |
| 6,414,361 | B2 | 7/2002 | Wong et al. |
| 6,566,158 | B2 | 5/2003 | Eriksen et al. |
| 6,580,128 | B2 | 6/2003 | Ohkubo |

(Continued)

FOREIGN PATENT DOCUMENTS

WO 9520824 A1 3/1995

(Continued)

OTHER PUBLICATIONS

AVCI, "Back-gate MOSFET for power-adaptive applications," Cornell University Ph.D. thesis, vol. 66014B of Dissertations Abstracts International, ISBN:0-542-10276-5; 2005, p. 2218.

(Continued)

*Primary Examiner* — Quoc Hoang
(74) *Attorney, Agent, or Firm* — Cantor Colburn LLP; Vazken Alexanian

(57) ABSTRACT

A semiconductor wafer structure for manufacturing integrated circuit devices includes a bulk substrate; a lower insulating layer formed on the bulk substrate, the lower insulating layer formed from a pair of separate insulation layers having a bonding interface therebetween; an electrically conductive layer formed on the lower insulating layer, the electrically conductive layer further having one or more shallow trench isolation (STI) regions formed therein; an etch stop layer formed on the electrically conductive layer and the one or more STI regions; an upper insulating layer formed on the etch stop layer; and a semiconductor layer formed on the upper insulating layer. A subsequent active area level STI scheme, in conjunction with front gate formation over the semiconductor layer, is also disclosed.

8 Claims, 12 Drawing Sheets

U.S. PATENT DOCUMENTS

| | | |
|---|---|---|
| 7,008,857 B2 | 3/2006 | Ghyselen et al. |
| 7,018,873 B2 | 3/2006 | Dennard et al. |
| 7,132,339 B2 | 11/2006 | Bryant et al. |
| 7,235,812 B2 | 6/2007 | Chu et al. |
| 7,323,370 B2 | 1/2008 | Furukawa |
| 7,410,904 B2 | 8/2008 | Stasiak et al. |
| 7,453,123 B2 * | 11/2008 | Dokumaci et al. ............ 257/347 |
| 2003/0186073 A1 | 10/2003 | Fitzgerald |
| 2005/0067055 A1 | 3/2005 | Choe et al. |
| 2005/0181612 A1 | 8/2005 | Brask et al. |
| 2006/0057836 A1 | 3/2006 | Nagarajan et al. |
| 2006/0172505 A1 | 8/2006 | Koester et al. |
| 2006/0231873 A1 | 10/2006 | Anderson et al. |
| 2006/0284251 A1 | 12/2006 | Hsu et al. |
| 2007/0034950 A1 | 2/2007 | Park et al. |
| 2007/0122998 A1 | 5/2007 | Droes et al. |
| 2007/0281441 A1 | 12/2007 | Dantz et al. |
| 2008/0001183 A1 | 1/2008 | Kapoor |
| 2008/0036000 A1 | 2/2008 | Anderson et al. |
| 2009/0127591 A1 | 5/2009 | Moriwaka |
| 2010/0176482 A1 | 7/2010 | Dennard et al. |

FOREIGN PATENT DOCUMENTS

| | | |
|---|---|---|
| WO | 2006001915 A2 | 1/2006 |
| WO | 2007030368 A2 | 3/2007 |
| WO | 2008148882 A2 | 12/2008 |
| WO | 2010080292 A1 | 7/2010 |

OTHER PUBLICATIONS

J. B. Yau et al.; "FDSOI CMOS with Dual Backgate Control for Performance and Power Modulation;" IEEE; 2009; pp. 84-85.

International Search Report; International Application No. PCT/US 09/67102; International Filing Date: Dec. 8, 2009; Date of mailing: Feb. 25, 2010; 3 pages.

S. Bedell et al.; "Mobility Scaling in Short-Channel Length Strained Ge-on-Insulator P-MOSFETs;" IEEE Electron Device Letters, vol. 29, No. 7, Jul. 2008; pp. 811-813.

T. Tezuka et al.; "Strained SOI/SGOI dual-channel CMOS technology based on the Ge condensation technique;" Semicondutor Science and Technology 22; 2007; pp. S93-S98.

R. Tsuchiya et al.; "Controllable Inverter Delay and Suppressing Vth Fluctuation Technology in Silicon on Thin BOX Featuring Dual Back-Gate Bias Architecture;" IEEE; 2007; pp. 475-478.

International Written Opinion; International Application No. PCT/US 09/67102; Date of mailing: Feb. 25, 2010; 7 pages.

International Search Report; International Application No. PCT/EP2010/066715; International Filing Date: Nov. 3, 2010; Date of Mailing: Feb. 11, 2011.

International Search Report—Written Opinion ; International Application No. PCT/EP2010/066715; International Filing Date: Nov. 3, 2010; Date of Mailing: Feb. 11, 2011.

* cited by examiner

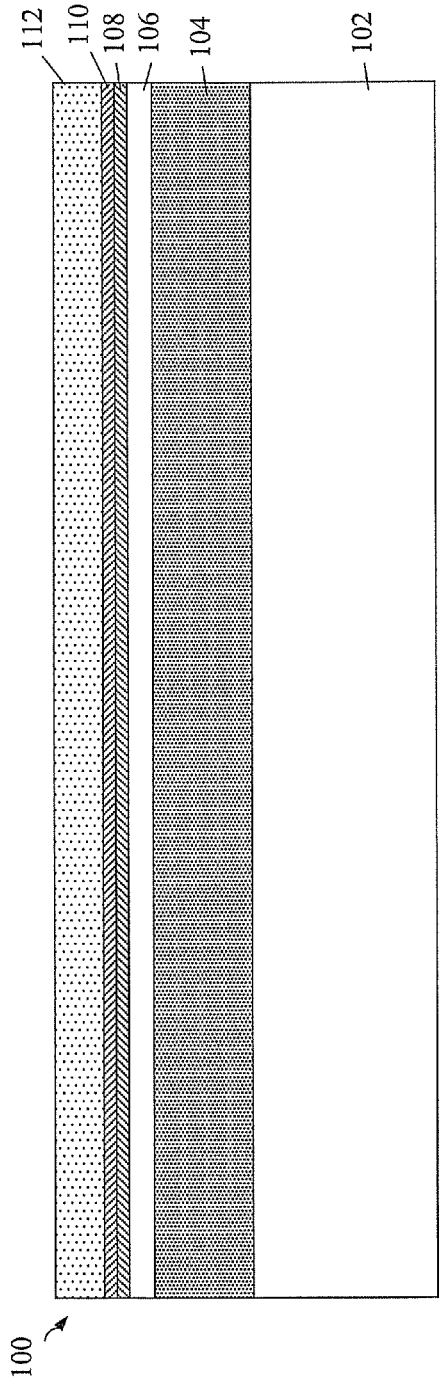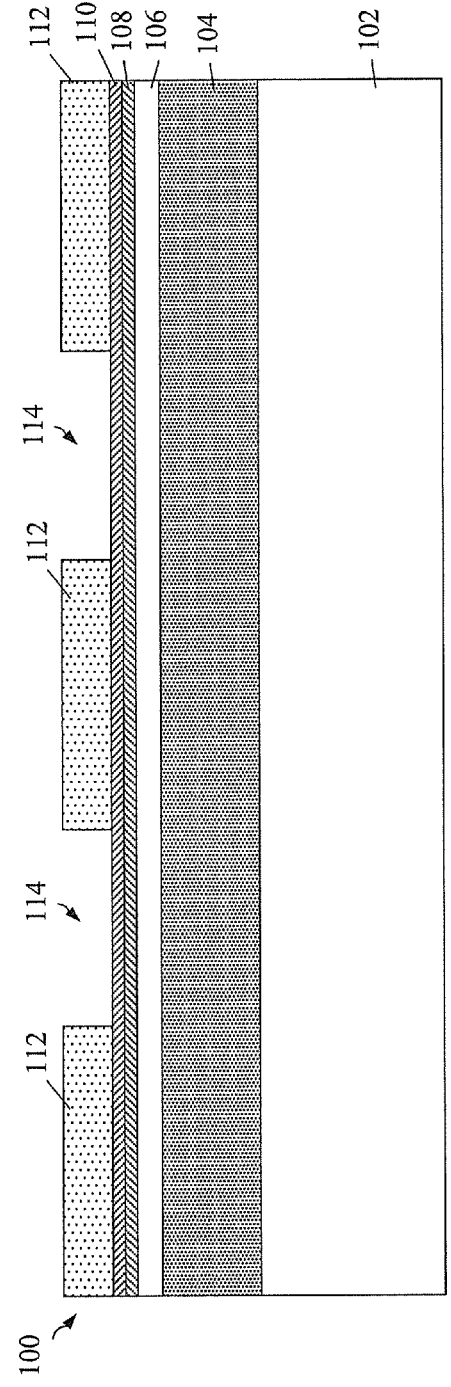

LOW COST FABRICATION OF DOUBLE BOX BACK GATE SILICON-ON-INSULATOR WAFERS WITH BUILT-IN SHALLOW TRENCH ISOLATION IN BACK GATE LAYER

CROSS-REFERENCE TO RELATED APPLICATION

This application is a divisional of U.S. patent application Ser. No. 12/352,071, filed Jan. 12, 2009, the disclosure of which is incorporated by reference herein in its entirety.

BACKGROUND

The present invention relates generally to semiconductor device manufacturing techniques and, more particularly, to low cost fabrication of double buried oxide (BOX), back gate (DBBG) silicon-on-insulator (SOI) wafers with built in shallow trench isolation (STI).

In SOI technology, a thin silicon layer is formed over an insulating layer, such as silicon oxide, which in turn is formed over a bulk substrate. This insulating layer is often referred to as a buried oxide (BOX) layer or simply a BOX. For a single BOX SOI wafer, the thin silicon layer is divided into active regions by shallow trench isolation (STI), which intersects the BOX, providing a total isolation for the active regions. Sources and drains of field effect transistors (FETs) are formed, for example, by ion implantation of N-type and/or P-type dopant material into the thin silicon layer with a channel region between the source and drain using the gate pattern to self-define the channel region. Prior to the formation of sources and drains, gates are formed on top of the channel region, for example, by deposition of a gate dielectric and conductor on the top surface of the thin silicon, followed by photolithographic patterning, and etching. Back gates can also be formed under the active region on a single BOX SOI wafer using the BOX layer as the back-gate dielectric, and can be defined by either P+ or N+ implantation. Transistors with back gates typically use relatively thin silicon and BOX layers to enable fully depleted device operation with a threshold voltage which is responsive to the back gate. Such FETs built in thin SOI technology with back gates have significant advantages such as, for example, reduced short channel effects, less threshold variability due to body doping fluctuations, and ability to use the back gate voltage to adjust the threshold.

In addition to single BOX SOI substrates, double BOX substrates may also be used in forming transistor devices having dual gate electrodes formed both above and below the transistor channel region. The conductive gate material formed below the device channel, also referred to as a back gate, is separated from the SOI active layer by a first BOX, and is separated from the substrate by a second BOX.

Typically, in order to manufacture such a double BOX wafer having an upper BOX and a lower BOX therein, at least one preformed SOI wafer is used as a starting substrate. However, the cost of preformed SOI wafer is usually several times that of device-quality bulk silicon wafers. Thus, purchasing SOI wafers as a starting substrate adds to the cost of forming a double BOX SOI wafer. Moreover, conventional double BOX back gate (DBBG) SOI wafers formed without providing well defined n-well and p-well (or n-region and p-region) isolation in the back gate layer can result in unacceptably large junction and/or current leakage during back gate device operations. Accordingly, it would be desirable to be able to fabricate a substrate such as a double BOX back gate (DBBG) SOI wafer, with or without additional structures located therein, at a lower cost with respect to conventional processes and in a manner that also provides better isolation to alleviate the current leakage problem.

SUMMARY

In an exemplary embodiment, a method of forming a semiconductor wafer structure for integrated circuit devices includes forming a first substrate portion having a first bulk substrate, a sacrificial layer formed on the first bulk substrate, a semiconductor layer formed on the sacrificial layer, a first insulating layer formed on the semiconductor layer, and an electrically conductive layer formed over the first insulating layer; patterning the electrically conductive layer so as to form shallow trench isolations (STI) regions therein; forming a second insulating layer, suitable for bonding to another insulating layer, on the electrically conductive layer; forming a second substrate portion having a second bulk substrate and a third insulating layer formed on the second bulk substrate; bonding the second substrate portion to the first substrate portion so as to define a bonding interface between the second and third insulating layers; separating the resulting bonded structure at a location within the first bulk substrate or the sacrificial layer and removing any remaining portion of the first bulk substrate; and removing any remaining portion of the sacrificial layer so as to define a double buried insulator back gate semiconductor-on-insulator wafer structure, wherein the first insulator layer comprises an upper insulating layer, the bonded second and third insulator layers together comprise a lower insulating layer, the semiconductor layer comprises a semiconductor-on-insulator layer, the patterned electrically conducting layer comprises dielectrically isolated back gate regions, and the second bulk substrate comprises a bulk substrate of the double buried insulator back gate semiconductor-on-insulator wafer structure.

In another embodiment, a method of forming a double buried insulator back gate semiconductor-on-insulator wafer structure for integrated circuit devices includes forming a first substrate portion having a first bulk substrate, a sacrificial layer formed on the first bulk substrate, a semiconductor layer formed on the sacrificial layer, a first insulating layer formed on the semiconductor layer, and an electrically conductive layer formed over the first insulating layer; patterning the electrically conductive layer so as to form shallow trench isolation (STI) regions therein, wherein an insulating material used to form the STI regions also forms a second insulating layer on the electrically conductive layer; forming a second substrate portion having a second bulk substrate and a third insulating layer formed on the second bulk substrate; implanting a hydrogen species through the second insulating layer, the electrically conductive layer, the first insulating layer and the semiconductor layer, stopping within or beyond the sacrificial layer; bonding the second substrate portion to the first substrate portion so as to define a bonding interface between the second and third insulating layers; performing an annealing procedure so as to create a front of connecting voids corresponding to a location of the hydrogen species; separating the bonded structure along the void front; and removing any remaining part of the first bulk substrate and the sacrificial layer on the semiconductor layer so as to define the double buried insulator back gate semiconductor-on-insulator structure, wherein the first insulating layer comprises an upper insulating layer, the bonded second and third insulating layers together comprise a lower insulating layer, the semiconductor layer comprises a semiconductor-on-insulator layer, the patterned electrically conductive layer comprises dielectrically isolated back gate regions, and the second bulk substrate comprises a bulk substrate of the double buried insulator back gate semiconductor-on-insulator wafer structure.

In another embodiment, a method of forming a double buried oxide (BOX), back gate (DBBG) silicon-on-insulator (SOI) wafer substrate structure for integrated circuit devices includes forming a first substrate portion having a first bulk silicon substrate, a silicon germanium (SiGe) layer epitaxially grown on the first bulk silicon substrate, a silicon layer epitaxially grown on the SiGe layer, a first oxide layer thermally grown or deposited on the silicon layer, an etch stop layer deposited on the first oxide layer, and an electrically conductive back gate layer formed on the etch stop layer; patterning the back gate layer so as to form shallow trench isolation (STI) regions therein, wherein an oxide material used to form the STI regions also forms a second oxide layer on the back gate layer; forming a second substrate portion having a second bulk silicon substrate and a third oxide layer thermally grown or deposited on the second bulk substrate; implanting a hydrogen species through the second oxide layer, the electrically conductive back gate layer, the etch stop layer, the first oxide layer and the silicon layer, stopping within or beyond the SiGe layer; bonding the second substrate portion to the first substrate portion so as to define a bonding interface between the second and third oxide layers; performing a first annealing procedure to enhance oxide-to-oxide bonding between the second and third oxide layers; performing a second annealing procedure at a higher temperature than the first annealing procedure so as to create a front of connecting voids corresponding to a location of the hydrogen species; separating the bonded structure along the void front; and removing any remaining part of the first bulk silicon substrate and the SiGe layer on the silicon layer so as to define the DBBG SOI wafer structure, wherein the first oxide layer comprises an upper BOX, the bonded second and third oxide layers together comprise a lower BOX, the silicon layer comprises a silicon-on-insulator (SOI) layer, the patterned back gate layer is disposed between the upper BOX and the lower BOX, and the second bulk substrate comprises a bulk substrate of the DBBG SOI wafer structure.

In still another embodiment, a semiconductor wafer structure for integrated circuit devices includes a bulk substrate; a lower insulating layer formed on the bulk substrate, the lower insulating layer formed from a pair of separate insulating layers having a bonding interface therebetween; an electrically conductive layer formed on the lower insulating layer, the electrically conductive layer further having one or more shallow trench isolation (STI) regions formed therein; an etch stop layer formed on the electrically conductive layer and the one or more STI regions; an upper insulating layer formed on the etch stop layer; and a semiconductor layer formed on the upper insulating layer.

In still another embodiment, a double buried oxide (BOX), back gate (DBBG) silicon-on-insulator (SOI) wafer structure for integrated circuit devices, includes a bulk silicon substrate; a lower buried oxide (BOX) layer formed on the bulk silicon substrate, the lower BOX layer formed from a pair of separate oxide layers having a bonding interface therebetween; an electrically conductive back gate layer formed on the lower BOX layer, the electrically conductive back gate layer further having one or more shallow trench isolation (STI) regions formed therein; an etch stop layer formed on the electrically conductive back gate layer and the one or more STI regions, the etch stop layer having a dielectric constant greater than 4.0; an upper BOX layer formed on the etch stop layer; and an SOI layer formed on the upper BOX layer.

In still another embodiment, a semiconductor device includes a double buried insulator back gate semiconductor-on-insulator structure having a bulk substrate, a lower insulating layer formed on the bulk substrate, the lower insulating layer formed from a pair of separate insulating layers having a bonding interface therebetween, an electrically conductive layer formed on the lower insulating layer, the electrically conductive layer further having one or more back gate level shallow trench isolation (STI) regions formed therein so as to define one or more back gate structures, an etch stop layer formed on the electrically conductive layer and the one or more back gate level STI regions, an upper insulating layer formed on the etch stop layer, and a semiconductor layer formed on the upper insulating layer; a plurality of active field effect transistor (FET) channel regions formed in the semiconductor layer, the FET channel regions separated from one another by one or more active area level STI regions; and one or more front gate structures formed over the active FET channel regions, such that the one or more back gate structures are wider than corresponding front gate structures to ensure shared electrical control of a corresponding FET channel.

BRIEF DESCRIPTION OF THE SEVERAL VIEWS OF THE DRAWINGS

Referring to the exemplary drawings wherein like elements are numbered alike in the several Figures:

FIGS. 1-10 are various cross-sectional views illustrating a method of forming a double buried oxide (BOX), back gate (DBBG) silicon-on-insulator (SOI) wafer structure, in accordance with an embodiment of the invention, where in particular:

FIG. 1 illustrates the formation of a first substrate portion used for the DBBG SOI structure;

FIGS. 2 and 3 illustrate lithographic patterning and formation of STI regions within a back gate layer of the first substrate portion;

FIG. 4 illustrates a hydrogen species implanted into the silicon germanium (SiGe) layer of the first substrate portion;

FIG. 5 illustrates the formation of a second substrate portion used for the DBBG SOI structure;

FIG. 6 illustrates the bonding of the first substrate portion to the second substrate portion;

FIG. 7 illustrates an annealing procedure to form a fracture front in the SiGe layer of the bonded structure;

FIG. 8 illustrates the removal of a top portion of the bonded structure following separation at the SiGe layer;

FIG. 9 illustrates the remaining bottom portion of the bonded structure and remaining SiGe layer following wafer separation;

FIG. 10 illustrates the completed DBBG SOI wafer structure with built in STI following removal of the remaining SiGe layer and final bonding annealing procedure;

DETAILED DESCRIPTION

Figure 3:
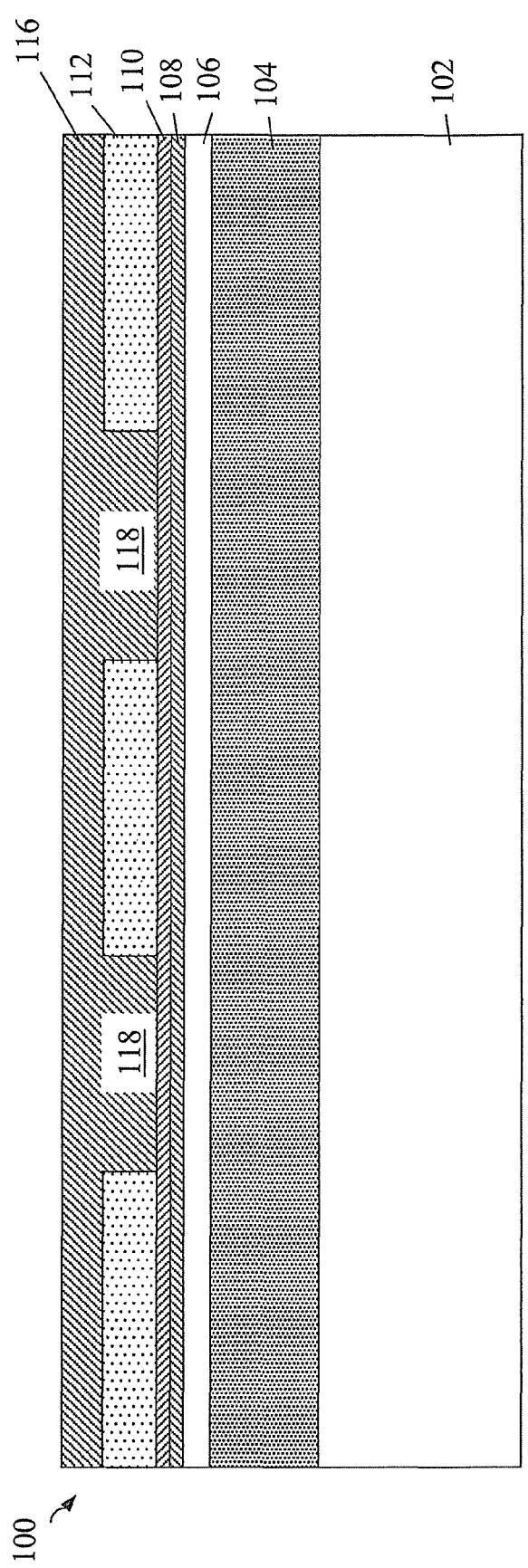

Disclosed herein is a method of fabricating low cost DBBG SOI wafers by eliminating the use of more expensive, preformed SOI wafers as a starting substrate. In brief, the embodiments utilize partially processed separate bulk silicon wafers that are bonded at one location and then subsequently separated at another location to form a double BOX structure, and with the least need for highly uniform chemical mechanical polishing (CMP) in the substrate fabrication. Moreover, the back gate layer formed above a lower BOX layer is built with shallow trench isolation (STI), which simplifies the subsequent device integration, reduces junction and/or current leakage between adjacent back gate regions, and decreases overlay capacitance from the back gates to the devices in the SOI layer.

FIG. 1 illustrates the formation of a first substrate portion 100, in which a bulk silicon substrate 102 has a sacrificial silicon germanium (SiGe) layer 104 (e.g., 5-1000 nanometers (nm) in thickness) deposited thereon, at an exemplary Ge concentration of about 10-35%. The SiGe is followed by a thin layer 106 (e.g., about 5-50 nm) of epitaxially grown silicon that will ultimately serve as the SOI layer of the double BOX structure. The silicon layer 106 may be formed in the same processing step as the SiGe layer (e.g., by shutting off a Ge gas source after completion of the SiGe layer formation). Then, a relatively thin (e.g., about 5-20 nm) oxide layer 108 is thermally grown or deposited on top of the silicon layer 106. The oxide layer 108 may be thermally grown or deposited at a temperature of about 600-800° C., for example.

As further shown in FIG. 1, an etch stop layer 110 is deposited at a thickness of about 5-10 nm on the oxide layer 108. The etch stop layer 110 is an insulator which may be a high dielectric constant (high-K) material such as, for example, SiN, $HfO_2$, $HfSiO_2$, $Al_2O_3$, etc. As used herein, a "high-K" material may refer to any material having a dielectric constant greater than 4.0. Then, an electrically conductive layer 112 of back gate material (e.g., amorphous silicon, doped or undoped polysilicon, metal, metal silicide, metal nitride, etc.) of about 20-100 nm in thickness is deposited on the high-K etch stop layer 110.

In FIG. 2, the back gate layer 112 is lithographically patterned and etched in order to define built in shallow trench isolation openings 114 within the back gate layer 112, terminated upon the etch stop layer 110. Alignment marks (not shown) may be optionally formed in order to align the STI regions in this layer to subsequent front gate structures formed over the SOI layer. The STI openings 114 are then filled with a deposited oxide layer 116 as shown in FIG. 3. The oxide layer 116 is deposited at about 200 to 250 nm in thickness, followed by a timed chemical mechanical polishing (CMP) step to reduce the topology, and to leave a remaining thickness of oxide material of about 10-50 nm upon the back gate layer 112. The STI regions of oxide material within the back gate layer itself are designated by 118 in FIG. 3.

Figure 4:
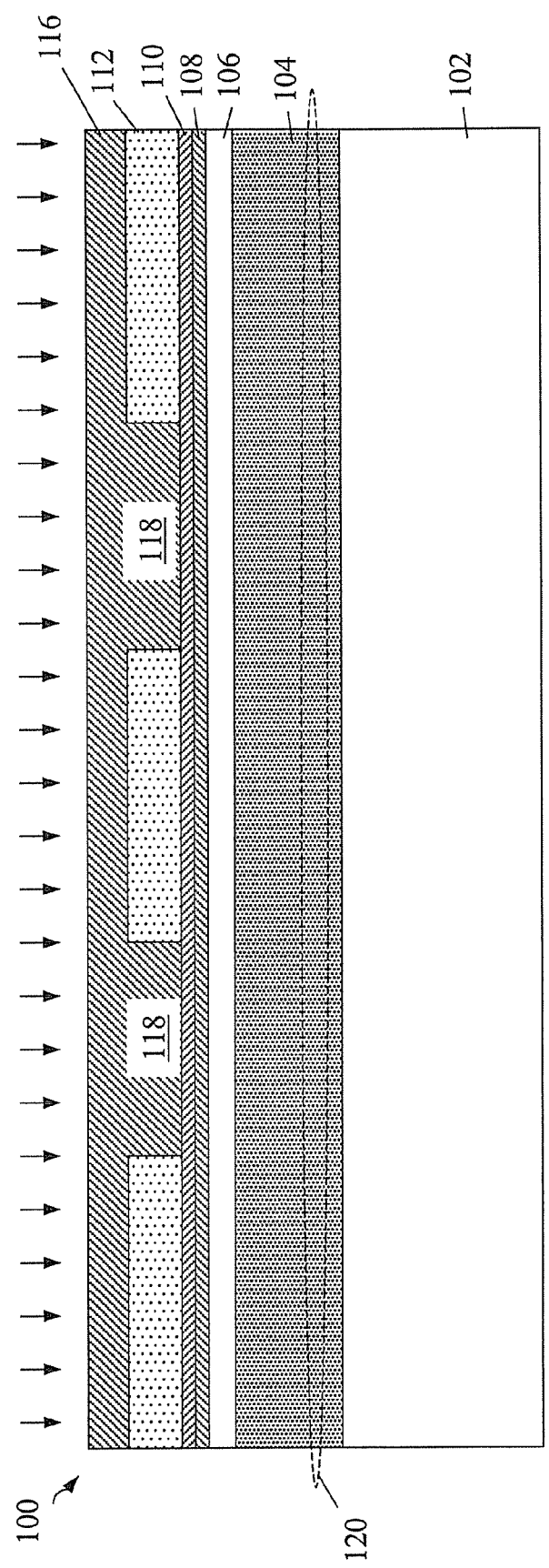

Proceeding to FIG. 4, a hydrogen implant step is then performed (indicated by the arrows) in order to insert a hydrogen species within or beyond the SiGe layer 104, in accordance with the well known Smart-Cut® process described in U.S. Pat. No. 5,374,564. In order to prevent damage to the silicon (SOI) layer 106, the hydrogen species implant conditions should be such that the species stops or peaks at a suitable location such as in the SiGe layer 104, as indicated by region 120 in FIG. 4.

Figure 5:
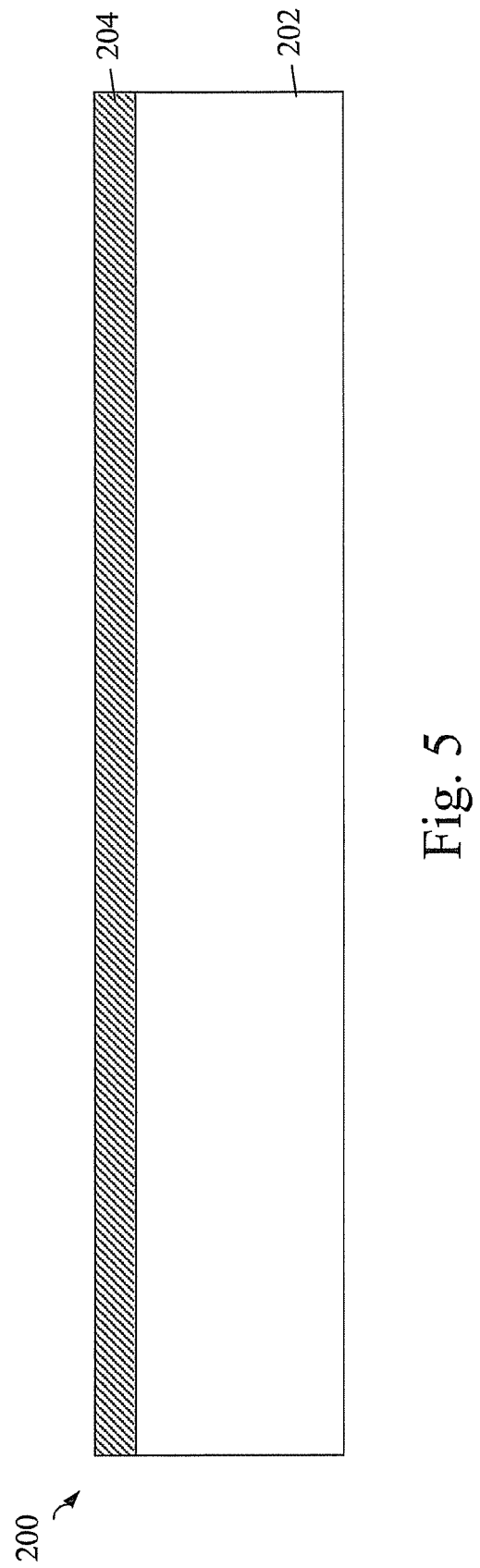
Figure 6:
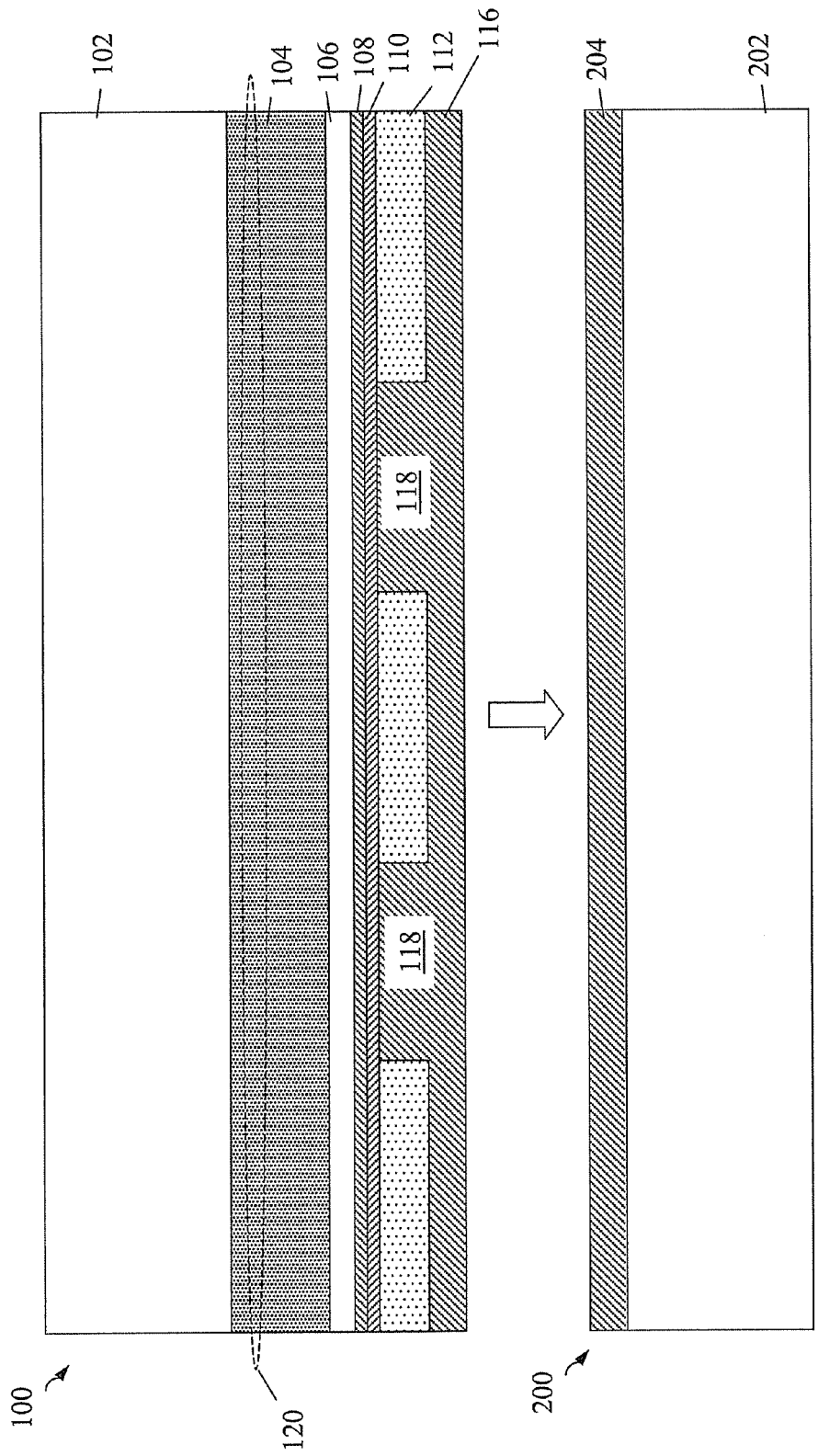

Referring next to FIG. 5, there is shown the formation of a second substrate portion 200, in which another bulk silicon substrate 202 has a thermal oxide layer 204 (e.g., 100-200 nanometers (nm) in thickness) thermally grown or deposited thereon. FIG. 6 illustrates the bonding of the first substrate portion 100 to the second substrate portion 200, wherein the oxide layer 116 of the first substrate portion 100 is bonded to the oxide layer 204 of the second substrate portion 200 through oxide-to-oxide bonding. Thus bonded, layers 116 and 204 combine to define a lower BOX layer for a double BOX substrate. A first annealing procedure (e.g., at about 300° C.) is performed in order to enhance the bonding interface between layers 116 and 204.

Figure 7:
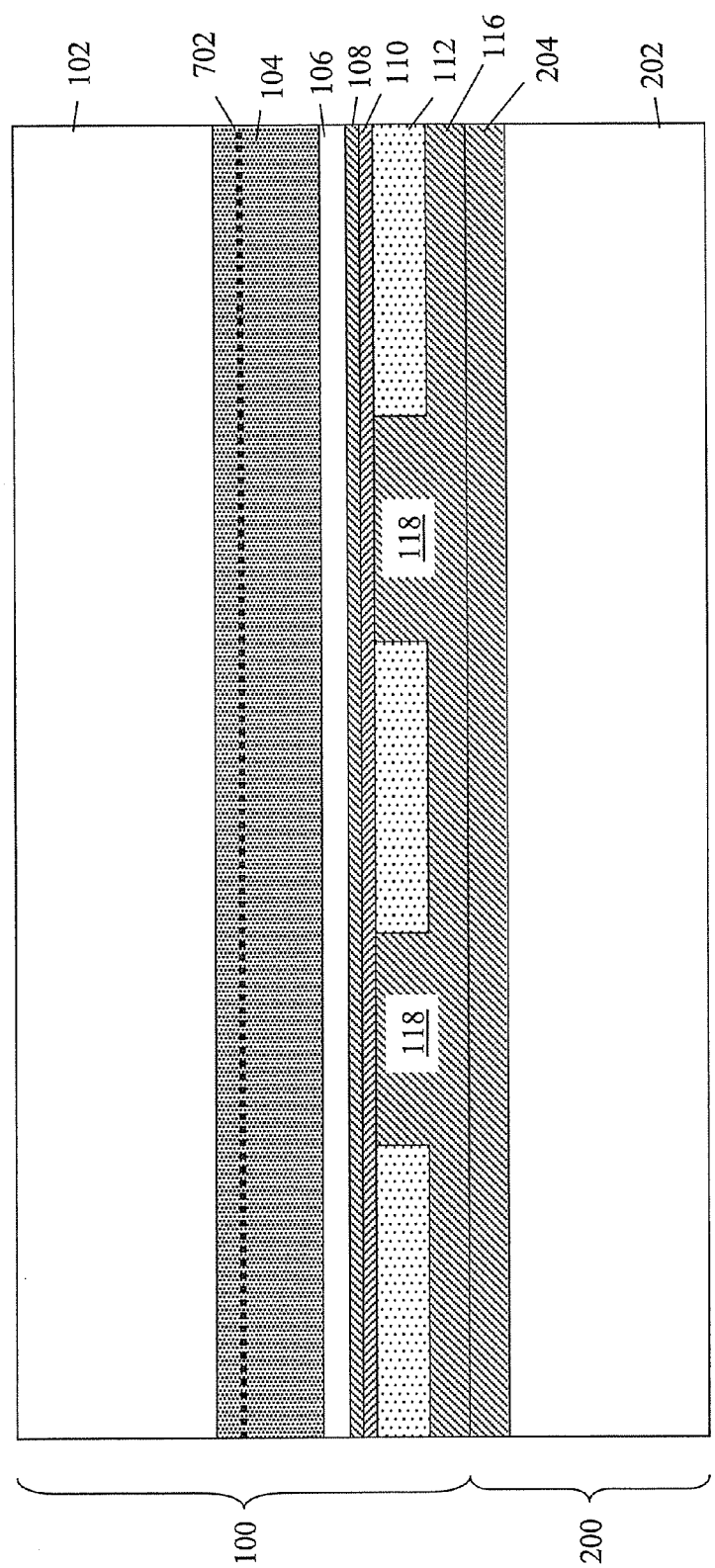
Figure 8:
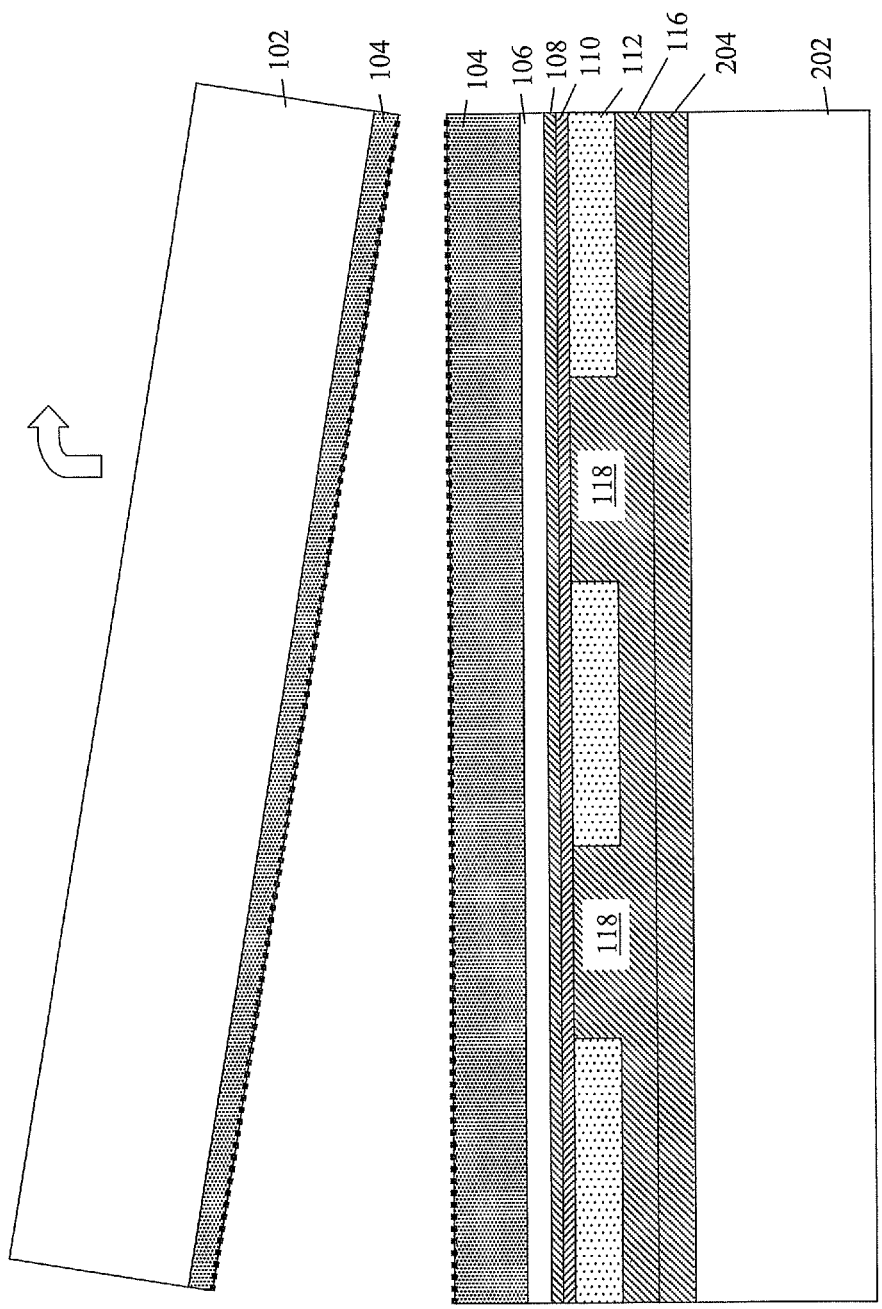
Figure 9:
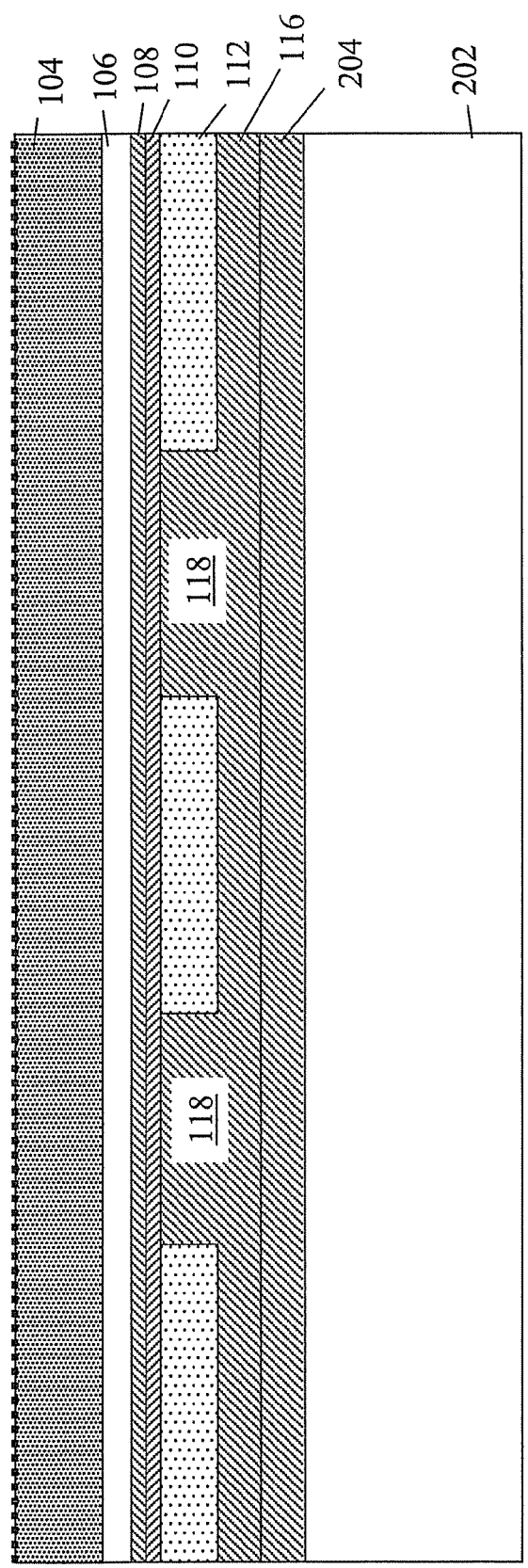

As then shown in FIG. 7, the structure undergoes a second annealing procedure (at a higher temperature than the first annealing procedure, e.g., at about 400° C.) so as to cause the hydrogen species to form a front of connecting voids 702 of hydride regions within the SiGe layer 104. The structure is then fractured along the front as shown in FIG. 8. The top portion including bulk substrate 102 and a portion of SiGe layer 104 is then removed, leaving the structure as shown in FIG. 9 in which a portion of the SiGe layer 104 remains following wafer separation. Again, it will be appreciated that in the event the implant region 120 is substantially defined beyond the SiGe layer 104 and into the bulk silicon substrate 102 during the implant procedure of FIG. 4, then the separation along the front in FIG. 8 would be depicted within bulk silicon substrate 102, and a portion thereof would remain atop the structure shown in FIG. 9.

Figure 10:
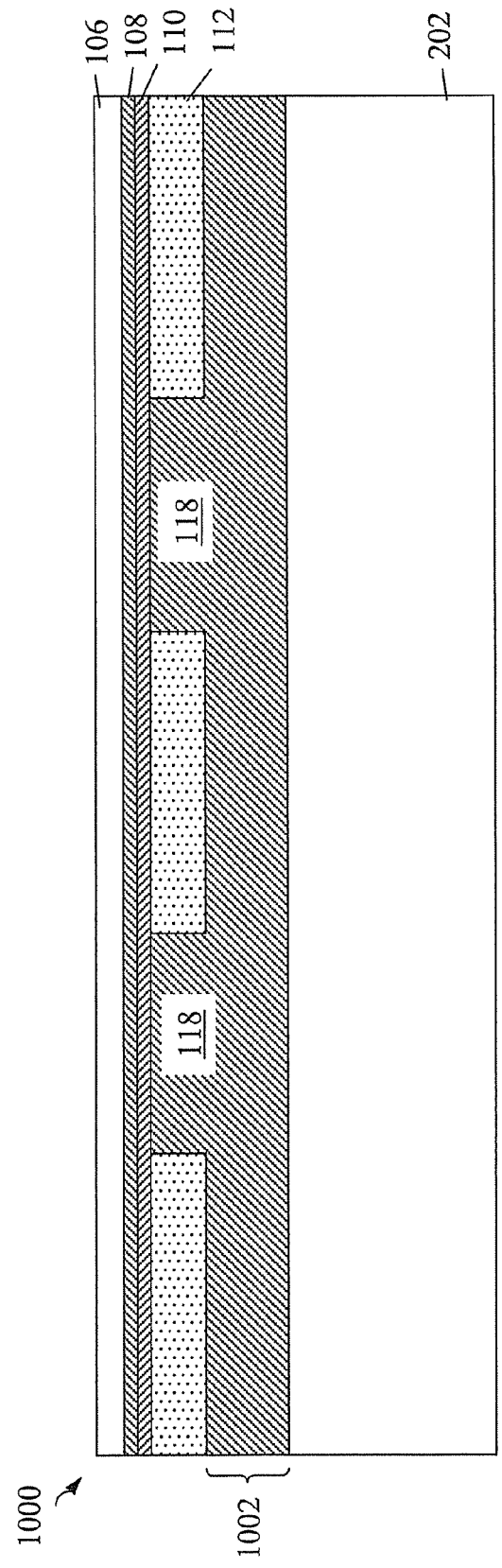

Next, any remaining portion of the first silicon substrate 102 is removed, for example, by polishing or by a selective wet etch with respect to silicon (e.g., a tetramethylammonium hydroxide (TMAH) etch), and the remaining SiGe layer 104 is removed using an etch selective with respect to SiGe such as a hot Huang A type solution ($NH_4OH:H_2O_2:H_2O$). Finally, another annealing procedure (at a higher temperature than the second annealing procedure, e.g., at about 800-1000° C.) is then performed to further enhance the oxide-to-oxide bonding. As shown in FIG. 10, this results in a double BOX back gate structure 1000 having a bulk substrate 202, a lower BOX layer 1002 (having the oxide bonding interface therein) over the substrate 202, a conductive back gate layer 112 over the lower BOX layer 1002 (with built in back gate level STI regions 118 formed therein), the etch stop layer 110, an upper BOX layer 108 over the high-K etch stop layer 110 and an SOI layer 106 over the upper BOX layer 108. Moreover, the DBBG SOI structure 1000 is formed in a manner such that an expensive SOI starting substrate is not used beforehand, and in a manner where the thickness of the remaining SOI layer 106 and the dielectric layers 108 and 110 are all well controlled.

Figure 11:
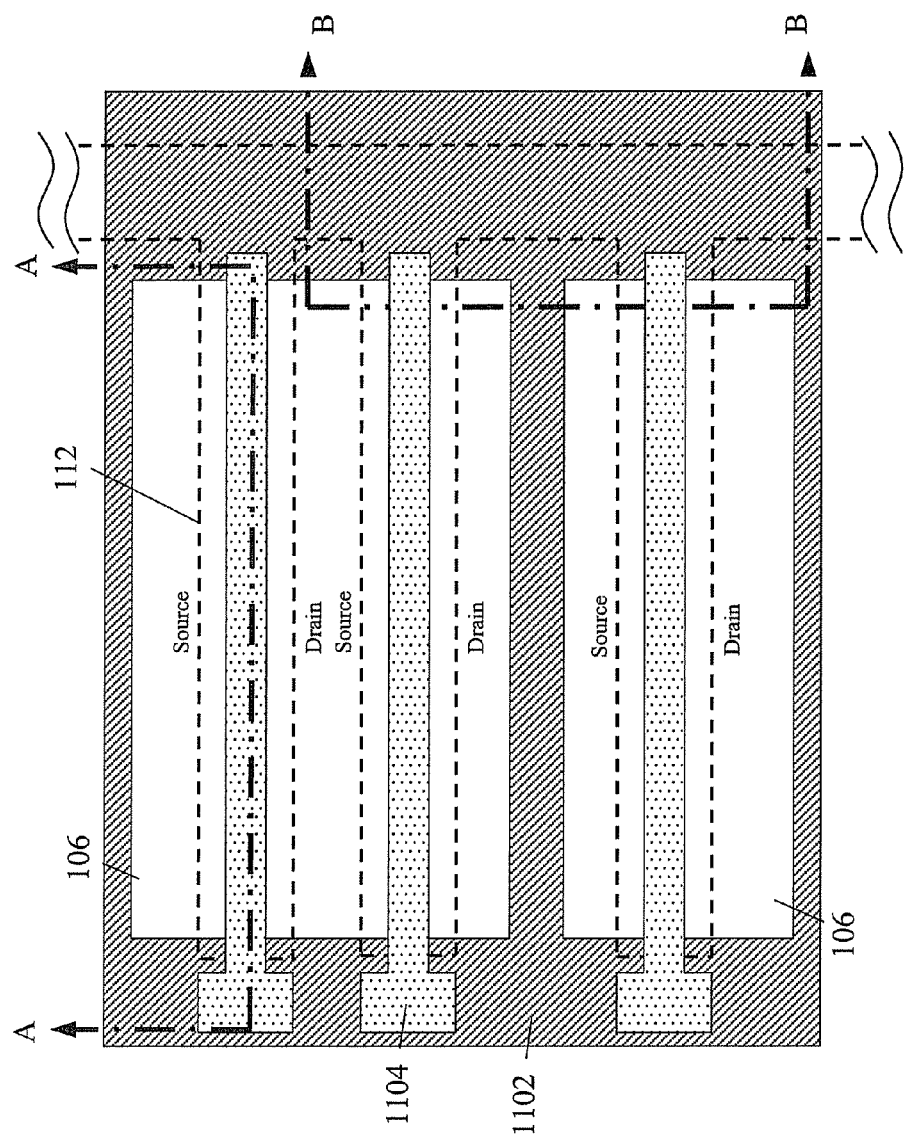
FIG. 11 is a top view illustrating a subsequent shallow trench isolation scheme for the DBBG SOI wafer structure in conjunction with front gate formation, in accordance with a further embodiment of the invention.

The patterning of the built in back gate level STI regions 118 (and therefore the back gate layer 112) is done to define back gates which overlap the active FET channel regions where front gates are placed in a subsequent process. Referring now to FIG. 11, there is shown a top view of a DBBG SOI structure, following the formation of active area level STI regions 1102 and front gate structures 1104 above the SOI layer 106.

The heavy dashed regions in FIG. 11 depict the patterned back gates 112, which, with respect to the built-in back gate level STI regions in the back gate layer, may be fabricated as interdigitated patterns. In other words, "fingers" of patterned back gate regions are interlocked with "fingers" of back level STI regions, as shown in FIG. 11. This allows for sufficient space for subsequent contacts to both the front and back gates, as well as reducing the overlap areas between the back gate and the source/drain regions. The back gates of groups of FETs may also be connected in common as illustrated in FIG. 11.

Figure 12A:
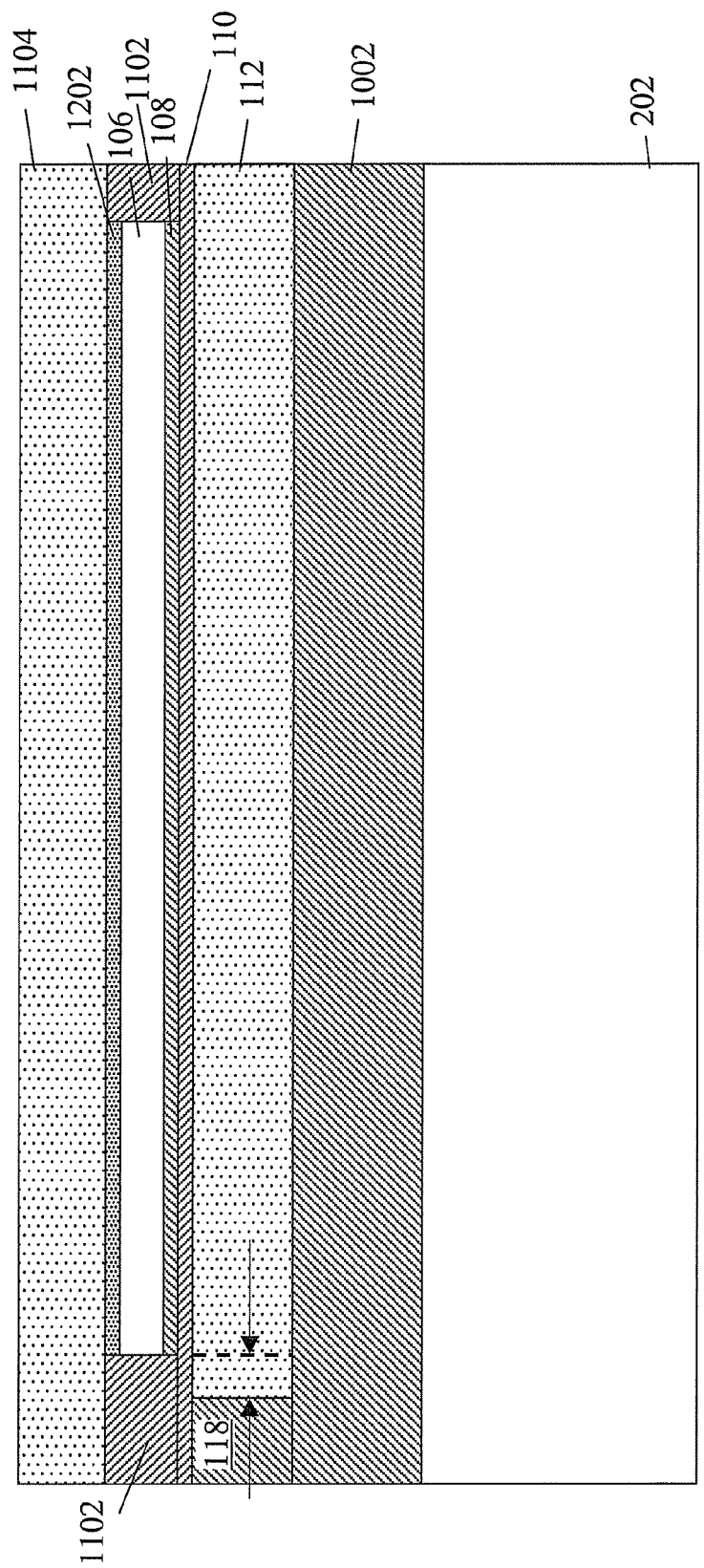
FIG. 12(a) is a cross sectional view taken along the arrows A-A of FIG. 11.
Figure 12B:
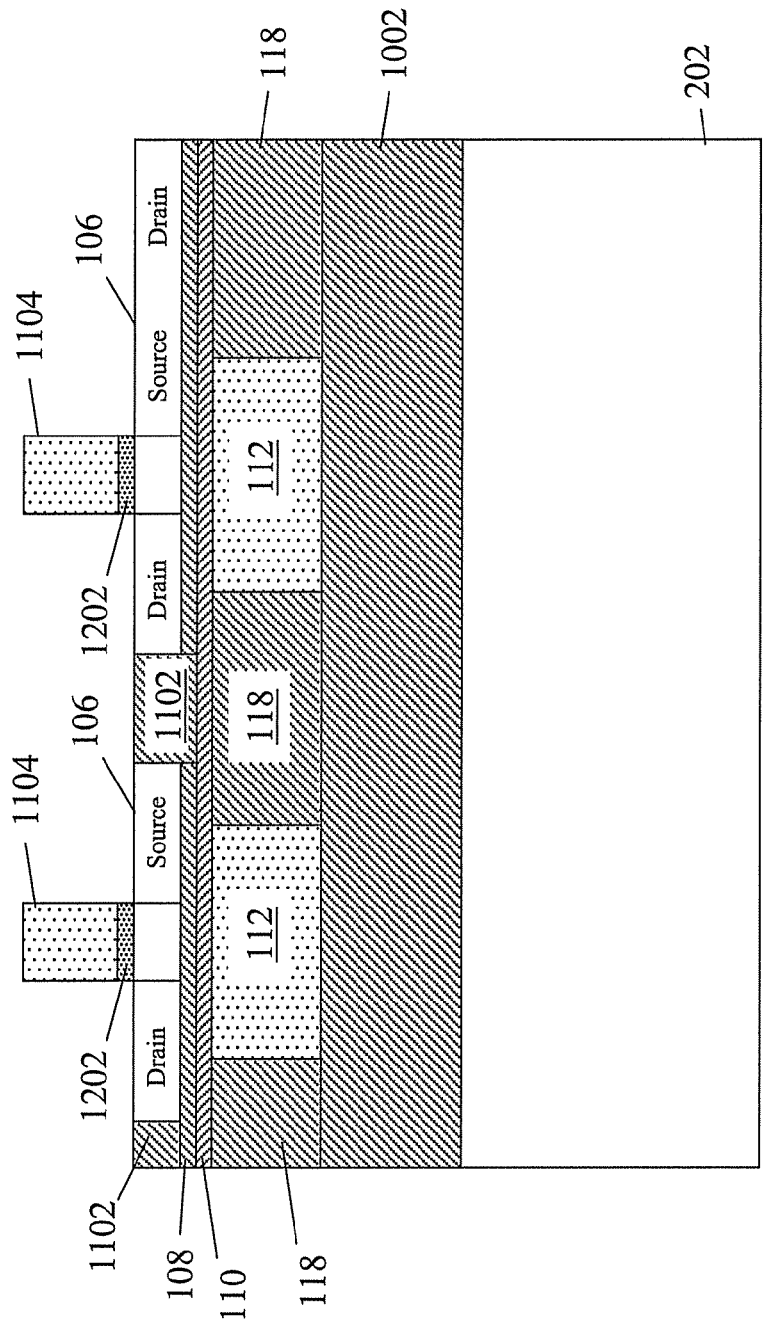
FIG. 12(b) is a cross sectional view taken along the arrows B-B of FIG. 11.

FIG. 12(a) is a cross sectional view taken along the arrows A-A of FIG. 11. With respect to the ends of the front gate 1104 and the back gate 112, an alignment tolerance is factored into the patterning of the back gate 112, as indicated by the arrows in FIG. 12(a). FIG. 12(a) additionally illustrates a front gate dielectric (e.g., oxide) layer 1202 between the SOI layer 106 and the front gate 1104. Finally, FIG. 12(b) is a cross sectional view of the structure taken along the arrows B-B in FIG. 11. This view depicts front gates 1104 that are not self-aligned to the built-in corresponding back gates 112. Therefore, the back gates 112 are made wider than the corresponding front gates 1104 in order to assure that the back gates 112 maintain proper shared electrical control of the FET channel under the front gates 1104 under worst case alignment conditions.

While the invention has been described with reference to a preferred embodiment or embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. A semiconductor wafer structure for integrated circuit devices, comprising:
   a bulk substrate;
   a lower insulating layer formed on the bulk substrate, the lower insulating layer formed from a pair of separate insulating layers having a bonding interface therebetween;
   an electrically conductive layer formed on the lower insulating layer, the electrically conductive layer further having one or more shallow trench isolation (STI) regions formed therein;
   an etch stop layer formed on the electrically conductive layer and the one or more STI regions;
   an upper insulating layer formed on the etch stop layer; and
   a semiconductor layer formed on the upper insulating layer.

2. The structure of claim 1, wherein:
   the upper insulating layer is about 5 to about 20 nanometers (nm) in thickness;
   the electrically conductive layer is about 20 to about 100 nm in thickness;
   the bonded pair of separate insulation layers forming the lower insulating layer have a total thickness of about 110 to about 250 nm;
   the etch stop layer is about 5 to about 10 nm in thickness; and
   the semiconductor layer is about 5 to about 50 nm in thickness.

3. A double buried oxide (BOX), back gate (DBBG) silicon-on-insulator (SOI) wafer structure for integrated circuit devices, comprising:
   a bulk silicon substrate;
   a lower buried oxide (BOX) layer formed on the bulk silicon substrate, the lower BOX layer formed from a pair of separate oxide layers having a bonding interface therebetween;
   an electrically conductive back gate layer formed on the lower BOX layer, the electrically conductive back gate layer further having one or more shallow trench isolation (STI) regions formed therein;
   an etch stop layer formed on the electrically conductive back gate layer and the one or more STI regions, the etch stop layer having a dielectric constant greater than 4.0;
   an upper BOX layer formed on the etch stop layer; and
   an SOI layer formed on the upper BOX layer.

4. The structure of claim 3, wherein:
   the upper BOX layer is about 5 to about 20 nanometers (nm) in thickness;
   the back gate layer is about 20 to about 100 nm in thickness;
   the bonded pair of separate oxide layers forming the lower BOX layer have a total thickness of about 110 to about 250 nm;
   the etch stop layer is about 5 to about 10 nm in thickness; and
   the SOI layer is about 5 to about 50 nm in thickness.

5. A semiconductor device, comprising:
   a double buried insulator back gate semiconductor-on-insulator structure comprising a bulk substrate, a lower insulating layer formed on the bulk substrate, the lower insulating layer formed from a pair of separate insulating layers having a bonding interface therebetween, an electrically conductive layer formed on the lower insulating layer, the electrically conductive layer further having one or more back gate level shallow trench isolation (STI) regions formed therein so as to define one or more back gate structures, an etch stop layer formed on the electrically conductive layer and the one or more back gate level STI regions, an upper insulating layer formed on the etch stop layer, and a semiconductor layer formed on the upper insulating layer;
   a plurality of active field effect transistor (FET) channel regions formed in the semiconductor layer, the FET channel regions separated from one another by one or more active area level STI regions; and
   one or more front gate structures formed over the active FET channel regions, such that the one or more back gate structures are wider than corresponding front gate structures to ensure shared electrical control of a corresponding FET channel.

6. The semiconductor device of claim 5, wherein the back gate level STI regions are formed in a manner so as to result in a plurality of back gate structures that are interdigitated with respect to the back gate level STI regions.

7. The semiconductor device of claim 6, wherein a plurality of the back gate structures corresponding to groups of FETs are connected in common.

8. The semiconductor device of claim 5, wherein the etch stop layer comprises an insulating layer having a dielectric constant of greater than 4.0, provides wet and dry etch isolation from STI fabrication processes for both back gate and active regions, and serves as a current leakage prevention mechanism.

* * * * *